United States Patent
Haruki

(10) Patent No.: US 6,417,557 B1
(45) Date of Patent: Jul. 9, 2002

(54) SEMICONDUCTOR DEVICE HAVING A CAPACITANCE ADJUSTMENT SECTION

(75) Inventor: Tadashi Haruki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/568,589

(22) Filed: May 11, 2000

(30) Foreign Application Priority Data

May 13, 1999 (JP) .......................... 11-133286

(51) Int. Cl.$^7$ .............................................. H01L 29/00
(52) U.S. Cl. ..................................... 257/532; 257/296
(58) Field of Search ................................. 257/296, 307, 257/532, 534, 535

(56) References Cited

U.S. PATENT DOCUMENTS

| 6,124,625 A | * | 9/2000 | Chern et al. | ................. | 257/532 |
| 6,198,153 B1 | * | 3/2001 | Liu et al. | ..................... | 257/532 |
| 6,201,272 B1 | * | 3/2001 | Kotecki et al. | ............. | 257/296 |

FOREIGN PATENT DOCUMENTS

| JP | 1-164050 | 6/1989 |
| JP | 2-304963 | 12/1990 |
| JP | 9-213808 | 8/1997 |
| JP | 9-270195 | 10/1997 |
| JP | 10-254577 | 9/1998 |

* cited by examiner

Primary Examiner—Ngân V. Ngô
(74) Attorney, Agent, or Firm—Young & Thompson

(57) ABSTRACT

A semiconductor device is provided comprising a capacitance adjustment section which enables the free setting of the amount of adjustment of a wiring capacitance, and for which the adjustment operation can be carried out simply. The semiconductor device comprises a capacitance adjustment section which is provided with a capacitance adjustment wiring which is connected to a target wiring for capacitance adjustment for adjusting wiring capacitance, and a constant voltage wiring which is formed on the same layer as the capacitance adjustment wiring and to which is applied a constant voltage. The capacitance adjustment wiring and the constant voltage wiring are positioned proximately and form a predetermined line capacitance, and this line capacitance is used to adjust a wiring capacitance of the target wiring for capacitance adjustment.

11 Claims, 7 Drawing Sheets

SEMICONDUCTOR DEVICE HAVING A CAPACITANCE ADJUSTMENT SECTION

BACKGROUND OF THE INVENTION

1. Field of the Invention

The present invention relates to a semiconductor device, and in particular to a semiconductor device comprising a capacitance adjustment section for conducting adjustment of wiring capacitance in a simple and rational manner.

The present specification is based on Japanese Patent Application, Unpublished, No. Hei 11-133286 which has been submitted in Japan and the content of which is incorporated as one portion of the present specification.

2. Description of the Related Art

FIG. 6 shows a sample construction, by conventional techniques, of a DRAM (Dynamic Random Access Memory). Up to now in semiconductor devices such as DRAM, package miniaturization has progressed considerably, in order to ensure that even with the increases in chip surface area associated with increasing memory capacity, the packaging density is not lowered. FIG. 6 shows an example of a CSP (chip size package) of a recently employed package type in which miniaturization has progressed significantly. In the CSP shown, a substrate 100 of a polyimide and a semiconductor chip 101 are fixed together with the chip surface facing the substrate and then sealed with a resin 102. A plurality of solder balls 103 which function as external terminals are provided on the lower surface of the substrate 100, while a plurality of pads (not shown in the figure) which function as chip wiring terminals are formed on the surface of the semiconductor chip 101. Each solder ball 103 and each pad are then connected electrically via copper wiring (not shown in the figure) formed on the upper surface of the substrate, and conducting materials (not shown in the figure) which are imbedded in through holes which penetrate through the substrate.

FIG. 7 is a schematic diagram showing a circuit block of a semiconductor chip. The chip comprises four memory cell blocks 104, and peripheral circuits 105 disposed about the periphery thereof. A single line of a plurality of pads 106 is formed in the center of the chip. In the figure, the wiring connected to the pads 106 has been omitted.

FIG. 8 shows the aforementioned DRAM viewed from beneath (from the solder ball side). In this example DRAM, the solder balls 103 on the substrate 100 are disposed in three lines on each of the left and right hand sides, while the pads 106 on the semiconductor chip 101 are disposed in a centrally positioned single line. Consequently, the wiring 107 for connecting each of the solder balls 103 and each of the pads 106, cannot be wired in a straight line, and must be suitably managed so as to avoid short circuits with other wiring 107. Moreover in FIG. 8 only a portion of the wiring 107 for connecting the solder balls 103 and the pads 106 is shown, although the remaining portions are wired in a similar manner.

However, as is evident from FIG. 8, because the length of each section of wiring 107 differs, the wiring capacitance of each section of wiring 107 will also differ. That is, the wiring capacitance from the external terminal of the DRAM to the pad will vary between pins, and left as is, there is a danger that the signal timing during the operations for the reading and writing of data will vary between pins, resulting in an error. Consequently, in this type of semiconductor chip, a capacitance adjustment section is usually provided for matching the wiring capacitance of each section of wiring.

FIG. 9 is a diagram showing the construction of a capacitance adjustment section of the aforementioned DRAM. The capacitance adjustment section 108 is basically constructed according to gate capacitance. That is, a capacitance is formed from a diffusion layer 109 formed on the surface of the semiconductor substrate, and gate electrodes 110a, 110b, 110c, and 110d which oppose the diffusion layer 109 via a gate insulating film. Furthermore, the plurality (four in the example shown) of gate electrodes 110a, 110b, 110c, 110d are provided for adjusting the capacitance value to various values, and each gate electrode 110a, 110b, 110c, 110d is connected to a first aluminum wiring 112 via a through hole 111. Each of the first aluminum sections of wiring 112 are connected respectively to a second aluminum wiring 114 via a through hole 113. Each of the second aluminum sections of wiring 114 is then connected to an input signal line 116 connected to an input pad 115.

Moreover in the present specification, "first aluminum wiring" refers to the first layer side (the lower layer) of aluminum wiring of a double layer wiring construction, whereas "second aluminum wiring" refers to the second layer side (the upper layer) of aluminum wiring.

The gate length of each of the aforementioned four gate electrodes 110a, 110b, 110c and 110d is different, and referenced against the shortest gate length, the other gate lengths are set to values twice, three times, and four times as long respectively. Correspondingly, the capacitance values when referenced against the capacitance of the shortest gate length are twice, three times, and four times as large respectively. That is, the capacitance values are set so that the sequence of values from the shortest gate length to the longest gate length are, for example, 10fF (femtoFarad), 20fF, 30fF, and 40fF respectively.

In a DRAM provided with this type of capacitance adjustment section 108, the matching of wiring capacitance is conducted by assembling the semiconductor chip into a packaged state, and following measurement and evaluation of the electrical characteristics of the package, using the evaluation results to determine the input signal wiring sections which require additional capacitance to match the largest observed wiring capacitance, and then using the capacitance adjustment section 108 to add the necessary capacitance. In the case where capacitance is actually to be added, the value of the capacitance being added is altered by making a design change to the mask pattern of the second aluminum wiring, and connecting a gate capacitance with one of the four aforementioned capacitance values to the input signal wiring. Consequently, in the case of the example described above, by suitable combinations of the four different gate capacitances, capacitance additions of between 10fF and 100fF in increments of 10fF are possible.

However, the following problems arise with the conventional DRAM wiring capacitance adjustment methods described above.

Conducting adjustments of the wiring capacitance by combining gate capacitances for which the capacitance values are fixed, means that adjustments can only be made for limited increments (10fF in the case of the above example) and up to a limited upper limit (100fF in the case of the above example), and so fine adjustments in the capacitance value are difficult to achieve. Provision of a plurality of gate capacitances incorporating smaller capacitance values can be seen as a way of alleviating this problem, but in such cases the increase in the number of gate capacitances increases the surface area occupied by the capacitance adjustment section, resulting in an undesirable increase in the surface area of the chip. Furthermore, addition of each new gate capacitance requires a design change in the mask pattern of the lower layer, meaning the time and effort required for mask design changes increases undesirably.

SUMMARY OF THE INVENTION

An object of the present invention is to provide a semiconductor device comprising a capacitance adjustment section which enables the free setting of the amount of adjustment of a wiring capacitance and for which the adjustment operation can be carried out simply.

In order to achieve the above object, a semiconductor device of the present invention comprises the following two methods.

First, a first semiconductor device according to the present invention comprises a capacitance adjustment section for adjusting wiring capacitance, and the capacitance adjustment section further comprises a capacitance adjustment wiring which is connected to a target wiring for capacitance adjustment for adjusting wiring capacitance, and a constant voltage wiring which is formed on the same layer as the capacitance adjustment wiring and to which is applied a constant voltage. The capacitance adjustment wiring and the constant voltage wiring are positioned proximately and form a predetermined line capacitance, and this line capacitance is used to adjust a wiring capacitance of the target wiring for capacitance adjustment. The constant voltage wiring may utilize power supply voltage wiring or earthed voltage wiring, for example. Furthermore, the shape of the capacitance adjustment wiring and the constant voltage wiring may incorporate bent sections, or be formed in a shape resembling the teeth of a comb.

Compared with the conventional technology where a capacitance adjustment section utilizes gate capacitance, a capacitance adjustment section of a first semiconductor device according to the present invention uses a proximately positioned capacitance adjustment wiring and a constant voltage wiring to generate a line capacitance. Furthermore, the capacitance adjustment wiring and the constant voltage wiring is not simply disposed in straight lines, but rather incorporates bends and shapes resembling the teeth of a comb so that the two lengths of wiring intermesh. Consequently, if the facing surface area of the two lengths of wiring is increased, then a predetermined capacitance value can be achieved within a limited occupation area. Furthermore, the size of the added capacitance can be adjusted freely by increasing or decreasing the facing surface area of the two lengths of wiring.

As a result, the present invention enables the provision of a highly reliable semiconductor device in which errors resulting from signal timing deviations between pins during the operations of reading and writing data will not occur.

The capacitance adjustment section should preferably be formed from wiring provided in the uppermost layer of a multilayer interconnection structure. Such a construction enables the capacitance value to be adjusted by changing only the mask pattern of the uppermost wiring layer, with no modification of mask patterns of any of the lower layers being required. Consequently, the amount of time and effort required for mask design changes associated with adjustment of the wiring capacitance can be reduced.

In addition, in the case where the capacitance adjustment section is formed from wiring in the uppermost layer, the capacitance adjustment section can be layered on top of any elements or wiring constructed in layers other than the uppermost layer. Such a construction means separate space is not required for the capacitance adjustment section, and so the surface area occupied by the capacitance adjustment section can be reduced, contributing to a reduction in the surface area of the chip.

The wiring which is the object of the wiring capacitance adjustment process, termed the "target wiring for capacitance adjustment" in the case of the present invention, may be an input signal line, or a clock signal line within a circuit.

A second semiconductor device according to the present invention also comprises a capacitance adjustment section for adjusting wiring capacitance, and the capacitance adjustment section further comprises an input pad formed from two conductive layers separated by an insulation layer. The two conductive layers form an interlayer capacitance, and this interlayer capacitance is used to adjust the wiring capacitance of input signal wiring. One specific method using this capacitance adjustment section for carrying out capacitance adjustment, comprises dividing at least one of the conductive layers which make up the capacitance adjustment section into a plurality of regions, and then adjusting the interlayer capacitance by either short circuiting or not short circuiting the two conductive layers for each of the plurality of divided regions.

Hence the capacitance adjustment section of the second semiconductor device according to the present invention generates an interlayer capacitance using the two conductive layers which form the input pads. Typically, the surface area of an input pad, and the thickness of an interlayer insulation layer are predetermined values, and so the value of the interlayer capacitance generated by the two conductive layers will also be a constant. Therefore the conductive layers which form an input pad are divided into a plurality of regions, and then for each of the plurality of divided regions, either a contact is formed between the two conductive layers to create a short circuit between the two layers so that that particular divided region will not generate a capacitance, or alternatively contact between the two layers is prevented so that no short circuit exists thereby ensuring that that particular divided region will form an interlayer capacitance. Consequently, by either increasing or decreasing the number of divided regions of the two conductive layers which are short circuited, the overall value of the interlayer capacitance for the input pad can be freely adjusted.

This method utilizes the input pads, which occupy a considerable surface area, as a capacitance adjustment section, and because additional space is not required for providing a capacitance adjustment section, this method is extremely effective, particularly in terms of reducing the surface area occupied by the capacitance adjustment section. In addition, the method also offers the advantage of enabling large capacitance adjustments. Furthermore, by dividing the conductive layer into small regions, small incremental capacitance adjustments are possible.

Moreover if possible, a conventional capacitance adjustment section utilizing gate capacitance may be replaced entirely with a capacitance adjustment section of the aforementioned first or second semiconductor devices according to the present invention, although the present invention is not limited to this situation, and appropriate combinations of conventional capacitance adjustment sections and capacitance adjustment sections of the first or second semiconductor devices according to the present invention are also possible. For example, following the generation of a certain capacitance using a conventional capacitance adjustment section, a capacitance adjustment section of the present invention could then be used for conducting fine adjustments to the wiring capacitance. So doing would enable both capacitance adjustment sections to work in cooperation in adjusting a wiring capacitance.

DETAILED DESCRIPTION OF THE PREFERRED EMBODIMENTS

As follows is a description of embodiments of the present invention, with reference to the drawings. However, the present invention is not limited by the following embodiments, and many variations and practical applications are possible.

First Embodiment

As follows is a description of a first embodiment of the present invention with reference to the drawings.

Figure 1:
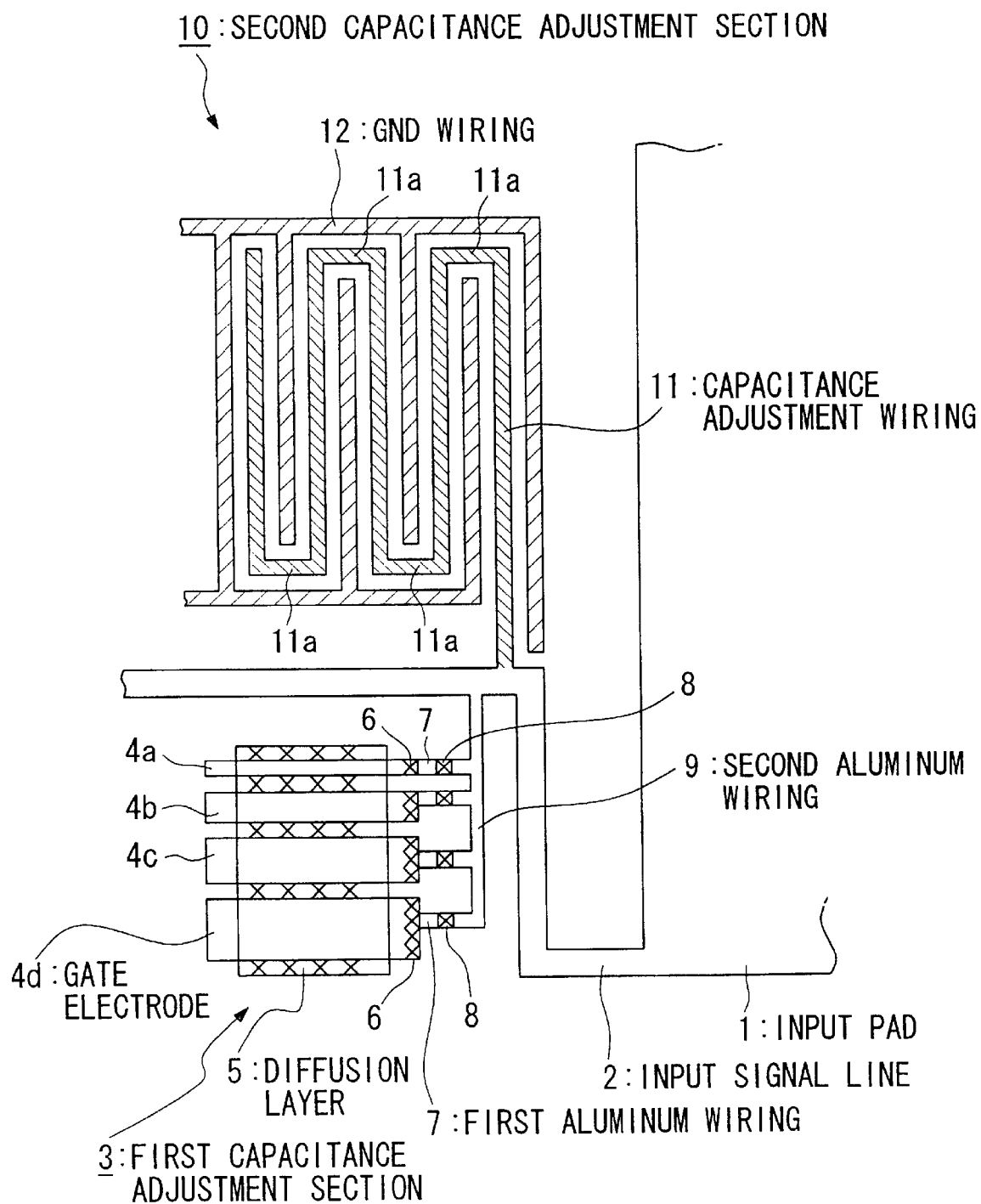
FIG. 1 is a plan view showing a capacitance adjustment section of a DRAM according to a first embodiment of the present invention.

FIG. 1 is a diagram showing a DRAM (semiconductor device) of this first embodiment, showing in particular the construction of a capacitance adjustment section which is a feature of the present invention. The wiring of the DRAM of the embodiment is constructed of double layer aluminum wiring.

According to the present embodiment, wiring which is the object of the wiring capacitance adjustment process (the target wiring for capacitance adjustment), is an input signal line 2 connected to an input pad 1. The input signal line 2 is formed of a second aluminum wiring. As can be seen from FIG. 1, in the present embodiment, a conventional capacitance adjustment section (hereafter referred to as the first capacitance adjustment section 3) is used as a capacitance adjustment section. That is, a first capacitance adjustment section 3 constructed using gate capacitance is provided, and four gate electrodes 4a, 4b, 4c, 4d formed on top of a diffusion layer 5 are each connected to a first aluminum wiring 7 via a through hole 6. Each of the sections of the first aluminum wiring 7 are connected to a second aluminum wiring 9 via another through hole 8, and the second aluminum wiring 9 is then connected to the input signal line 2. The capacitance value of each gate capacitance is set to, for example, 10fF, 20fF, 30fF, and 40fF respectively, and by suitable combinations of the four different gate capacitance values, capacitance additions of between 10fF and 100fF, in increments of 10fF, are possible. In this particular case, all of the gate capacitances are connected to the input signal line 2, resulting in a capacitance totaling 100fF being added.

Moreover in the present embodiment, in addition to the first capacitance adjustment section 3, another capacitance adjustment section characteristic of the present invention (hereafter referred to as the second capacitance adjustment section 10) is also used for adjustments in the wiring capacitance. The construction of the second capacitance adjustment section 10 comprises capacitance adjustment wiring 11 with four bent portions 11a which branches off from a point partway along the input signal line 2. The capacitance adjustment wiring 11 is also formed of the second aluminum wiring, in the same manner as the input signal line 2. In contrast, ground wiring 12 (constant voltage wiring, hereafter referred to as GND wiring) which is branched off from a main ground wiring (not shown in the figure) passing through the chip, is formed in a shape resembling the teeth of a comb so as to intermesh with the bent shape of the capacitance adjustment wiring 11. The GND wiring 12 is also formed from the second aluminum wiring, in the same manner as the capacitance adjustment wiring 11. The capacitance adjustment wiring 11 and the GND wiring 12 face one another in a proximate arrangement, forming a line capacitance of the order of several hundred fF. The second capacitance adjustment section 10 for adjusting the wiring capacitance of the input signal line 2 is constructed from this line capacitance. In FIG. 1, for the sake of clarity, hatching has been used to indicate the capacitance adjustment wiring 11 and the GND wiring 12.

According to a DRAM of the present embodiment, which is equipped with the first and second capacitance adjustment sections 3 and 10 respectively, described above, matching the input signal line wiring capacitance between pins is carried out by assembling the semiconductor chip into a packaged state, and following measurement and evaluation of the electrical characteristics of the package, using the evaluation results, and the first and second capacitance adjustment sections 3 and 10 to add capacitance as required to match the largest observed wiring capacitance. That is, because a DRAM of the present embodiment is equipped with the first and second capacitance adjustment sections 3 and 10 respectively, when adjustments of the wiring capacitance of an input signal line 2 are carried out, both capacitance adjustment sections 3 and 10 can be utilized and the wiring capacitance adjusted as required. For example, in the case where the maximum capacitance possible from the first capacitance adjustment section 3 of 100fF is added to a wiring capacitance and the capacitance is still insufficient, the second capacitance adjustment section 10 can then be used. In such a case, by adjusting, as appropriate, the length of the capacitance adjustment wiring 11 and the GND wiring 12 and thereby altering the facing surface area of the two lengths of wiring 11 and 12, the capacitance value to be added can be finely adjusted.

In a DRAM according to the first embodiment, because the second capacitance adjustment section 10 is constructed of bent capacitance adjustment wiring 11 and GND wiring 12 which is shaped resembling the teeth of a comb, the desired wiring capacitance can be realized with a high degree of precision, without the requirement for a large occupation area for the capacitance adjustment section. In the first capacitance adjustment section 3, the second aluminum wiring determines whether or not each of the gate capacitances is connected to the input signal line 2, and the second aluminum wiring is also used to adjust the length of the capacitance adjustment wiring 11 and the GND wiring 12 in the second capacitance adjustment section 10. Consequently, the second aluminum wiring pattern is the only mask pattern which need be altered in adjusting the wiring capacitance, and there is no requirement to alter any mask patterns at lower level layers. As a result, the time and effort required for mask design changes associated with the adjustment of wiring capacitance is able to be reduced.

Figure 2:
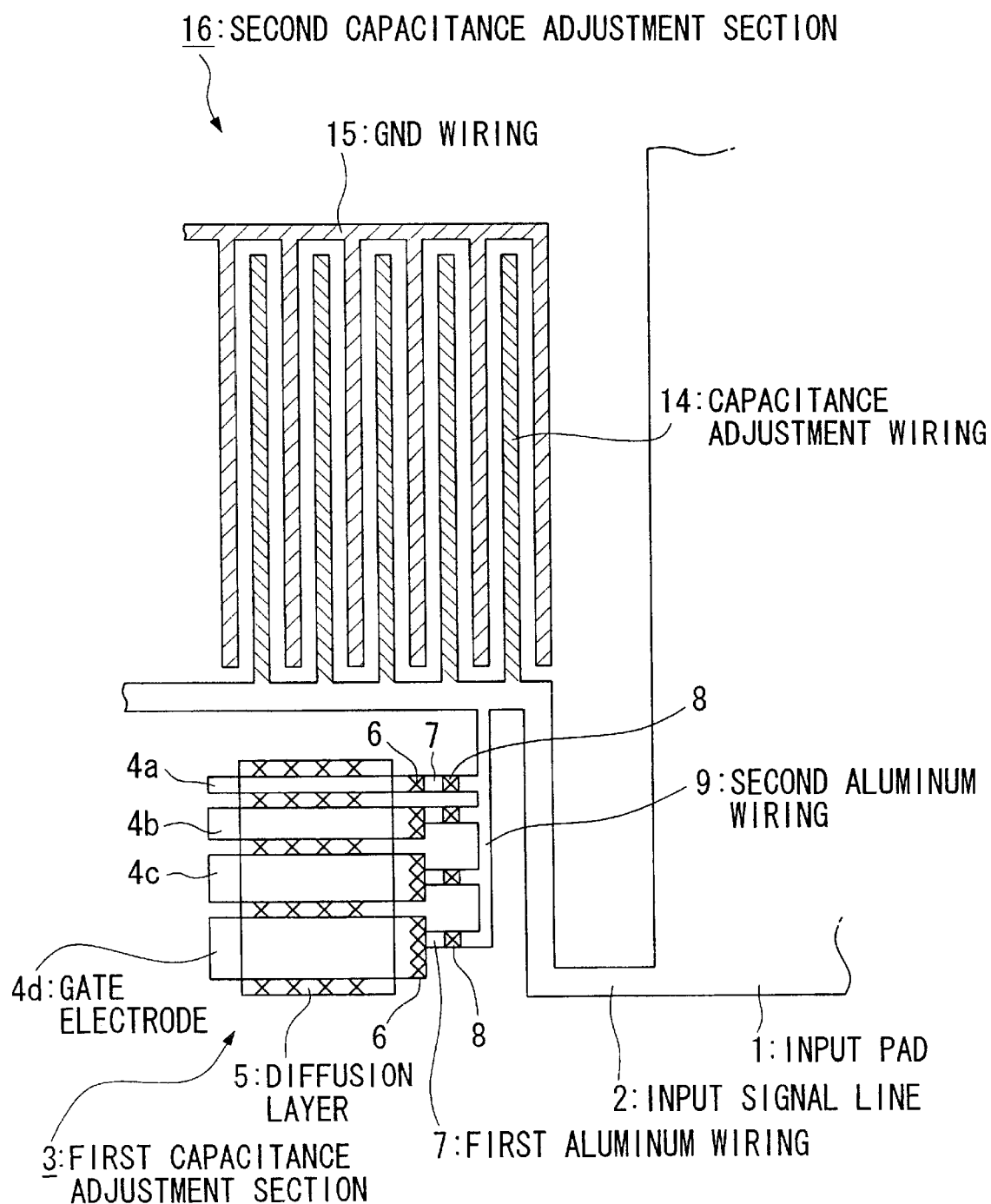
FIG. 2 is a plan view showing a sample variation of the above capacitance adjustment section.

According to this first embodiment, the second capacitance adjustment section 10 is constructed of the capacitance adjustment wiring 11 comprising four bent portions 11a, and the GND wiring 12 in a shape resembling the teeth of a comb, but the actual shape of the capacitance adjustment wiring and the GND wiring is not limited to these shapes, and many design changes are possible. For example a second capacitance adjustment section 16 is possible in which, as is shown in FIG. 2, both capacitance adjustment wiring 14 and GND wiring 15 is formed in a shape resembling the teeth of a comb, with the respective teeth then intermeshing. In such a case, the wiring capacitance value is able to be adjusted freely, in the same manner as that described for FIG. 1.

Second Embodiment

As follows is a description of a second embodiment of the present invention with reference to the drawings.

Figure 3:
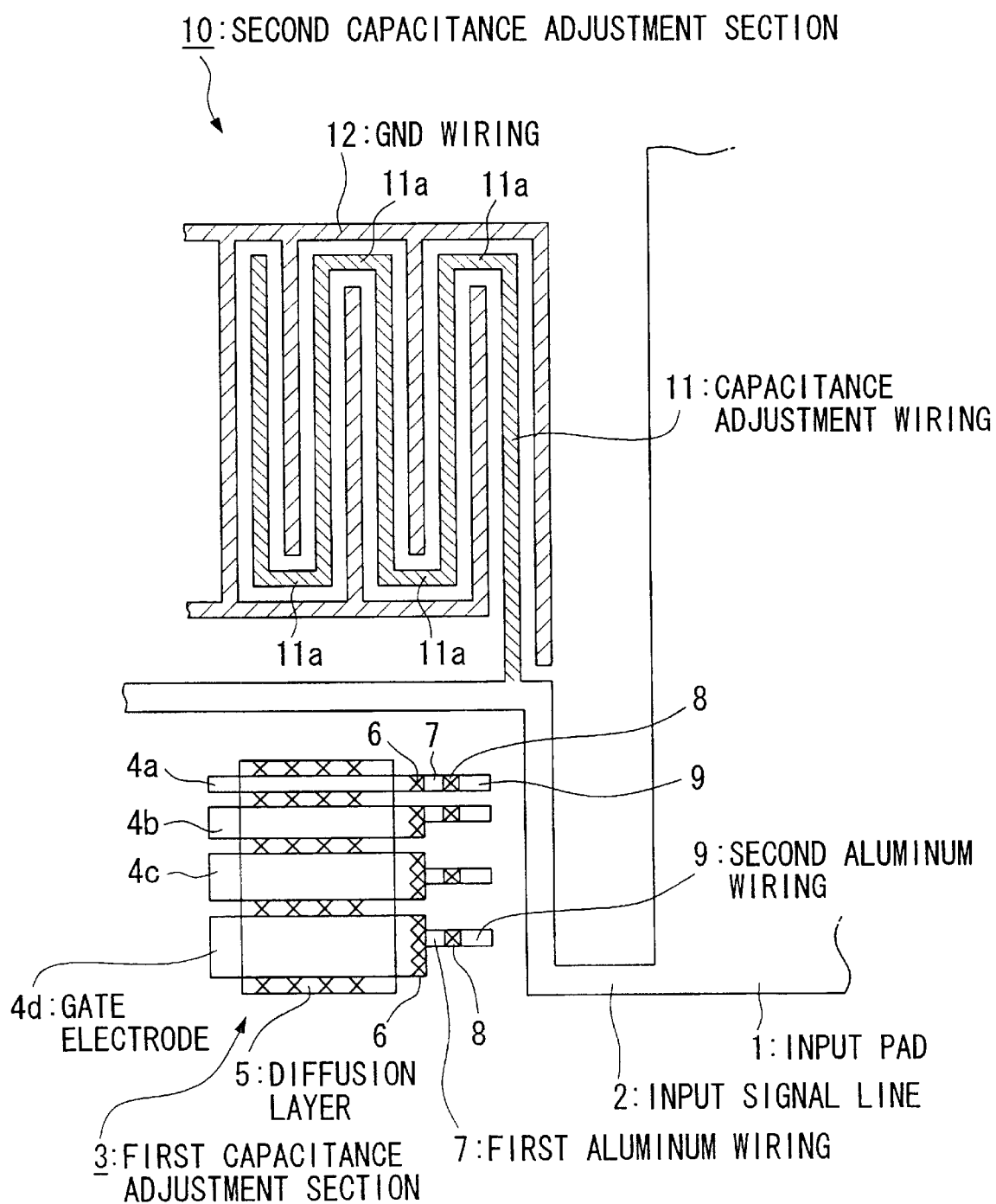
FIG. 3 is a plan view showing a capacitance adjustment section of a DRAM according to a second embodiment of the present invention.

FIG. 3 is a diagram showing a DRAM (semiconductor device) of this second embodiment, showing in particular the construction of a capacitance adjustment section which is a feature of the present invention.

The first embodiment showed an example in which a combination of a first capacitance adjustment section 3 based on conventional technology and a second capacitance adjustment section 10 characteristic of the present invention were used for adjusting the wiring capacitance of an input signal line 2, whereas in the second embodiment a first capacitance adjustment section 3 is not used, and adjustments of wiring capacitance are conducted via only a second capacitance adjustment section 10. Hence in FIG. 3, the construction of the second capacitance adjustment section 10 comprising capacitance adjustment wiring 11 and GND wiring 12 is identical with that described for the first embodiment (and those elements which are the same as those of FIG. 1 are labeled with the same numerals), but the four gate capacitances comprising the first capacitance adjustment section 3 are not connected to the input signal line 2.

The DRAM of this embodiment then, shows an example in which all the capacitance added during adjustments of wiring capacitance, is provided by the second capacitance adjustment section 10. This embodiment offers the same effects as those observed for the first embodiment, in that a desired wiring capacitance can be realized with a high degree of precision without the requirement for a large occupation area for the capacitance adjustment section, and furthermore the time and effort required for mask design changes associated with the adjustment of wiring capacitance is able to be reduced.

Moreover, in the first and second embodiments, the first capacitance adjustment section 3 and the second capacitance adjustment section 10 are provided at separate locations. However, because the first capacitance adjustment section 3 is formed from the gate capacitances and the second capacitance adjustment section 10 is formed from only the second aluminum wiring, it is also possible to layer the second capacitance adjustment section 10 on top of the first capacitance adjustment section 3. Particularly in the case of the second embodiment, because the first capacitance adjustment section 3 is not used, no second aluminum wiring at all exists above the first capacitance adjustment section 3, and so the capacitance adjustment wiring 11 and the GND wiring 12 which make up the second capacitance adjustment section 10 can be configured freely, as required. Alternatively, if there is another region in which no second aluminum wiring exists, then the second capacitance adjustment section 10 may also be formed thereon. By using this type of construction, an additional reduction can be made in the surface area occupied by the capacitance adjustment section, enabling a further contribution to be made to reducing the overall surface area of the chip.

Moreover, in the first and second embodiments, examples are shown in which the second capacitance adjustment section 10 is constructed from the capacitance adjustment wiring 11 and the GND wiring 12, but the capacitance adjustment section may also be constructed from capacitance adjustment wiring and power supply voltage wiring (VDD wiring). In such a case, the same effects as those described for the above embodiments can be achieved. GND wiring or VDD wiring can be readily utilized as the constant voltage wiring for the capacitance adjustment section of the present invention, but if other wiring which has a continuous constant voltage applied thereto is available in a suitable location, then such wiring could also be utilized.

Third Embodiment

As follows is a description of a third embodiment of the present invention with reference to the drawings.

Figure 4:
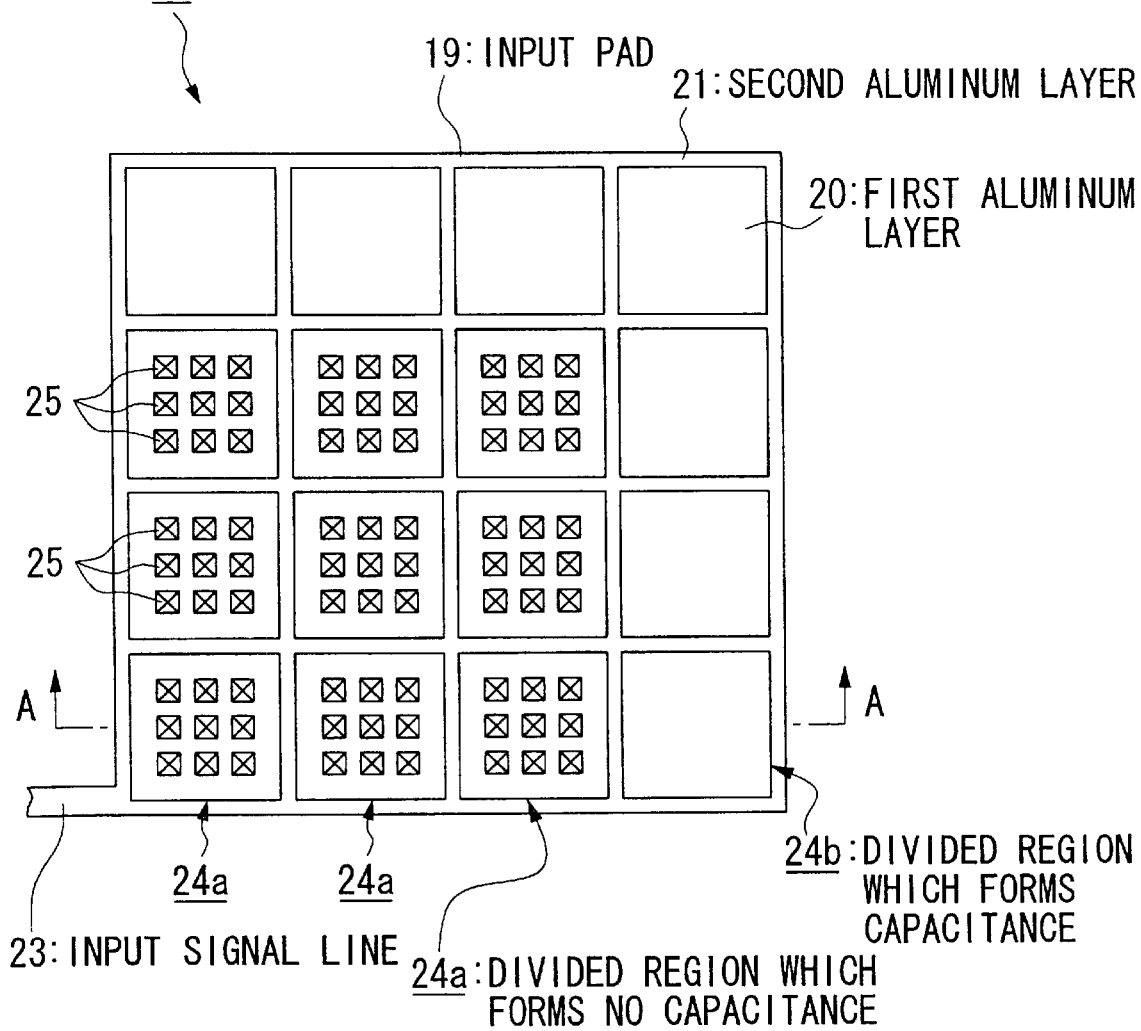
FIG. 4 is a plan view showing a capacitance adjustment section of a DRAM according to a third embodiment of the present invention.
Figure 5:
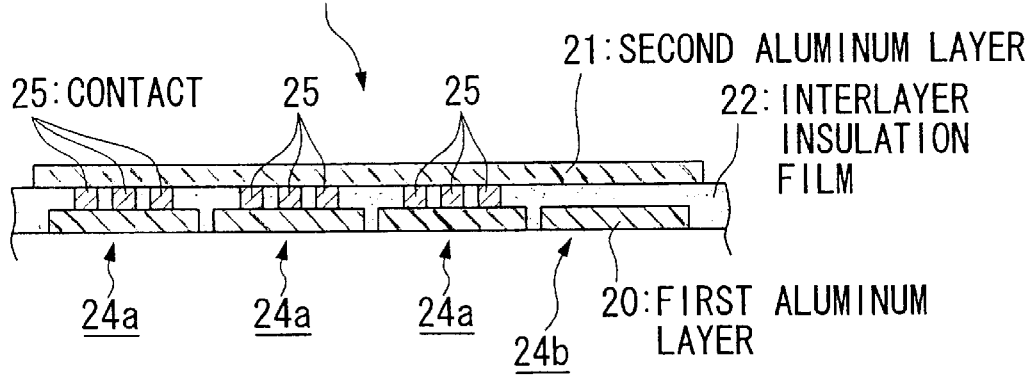
FIG. 5 is a cross-sectional view along the line A—A of FIG. 4.
Figure 6:
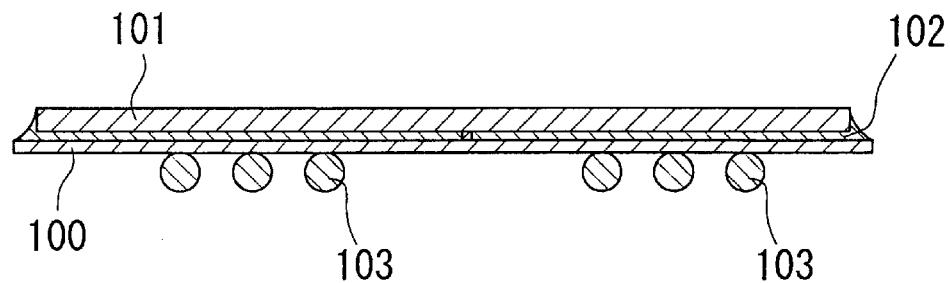
FIG. 6 is a diagram showing an example of a packaged DRAM, in particular an example of a CSP.
Figure 7:
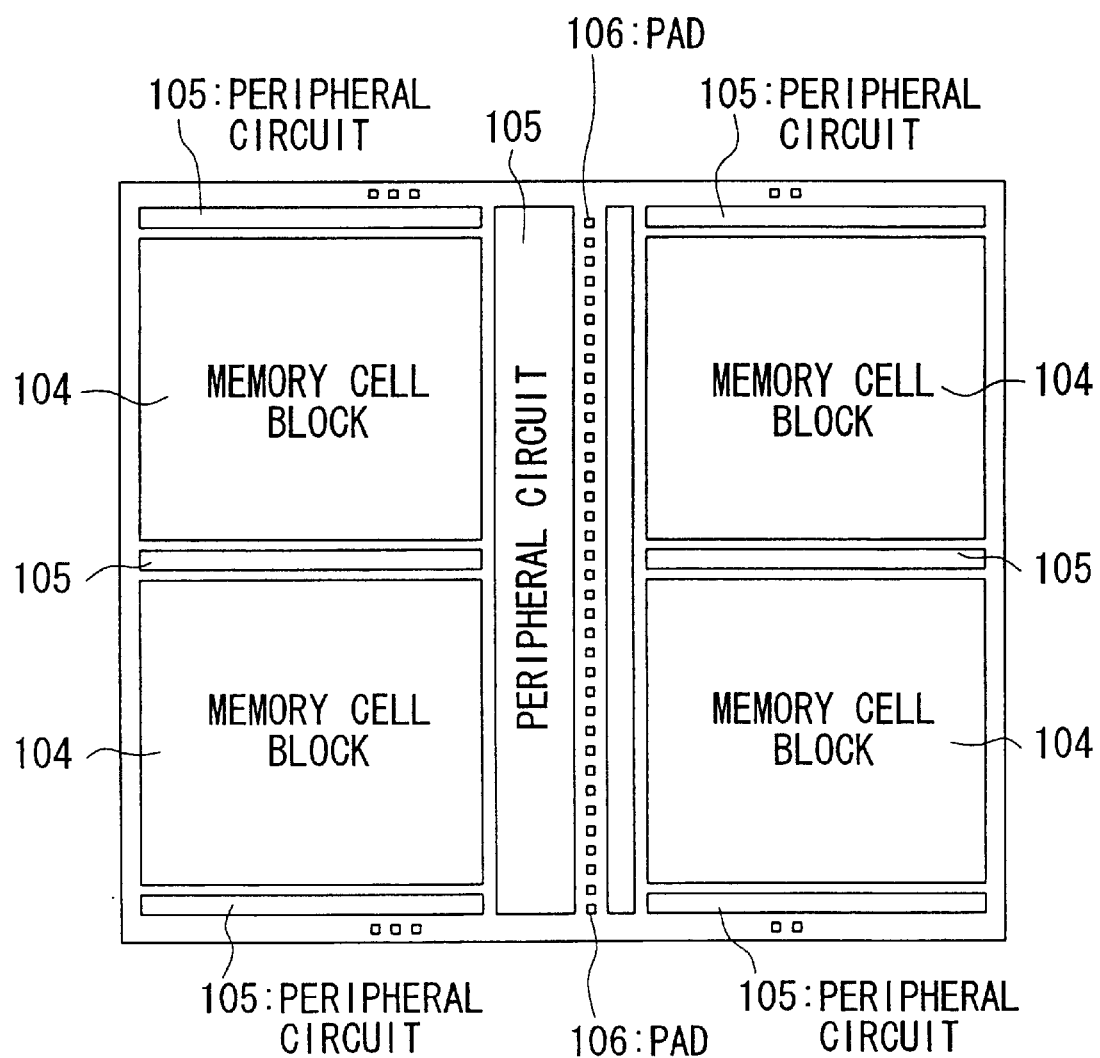
FIG. 7 is a schematic diagram showing a sample of the construction of a circuit block from a DRAM chip.
Figure 8:
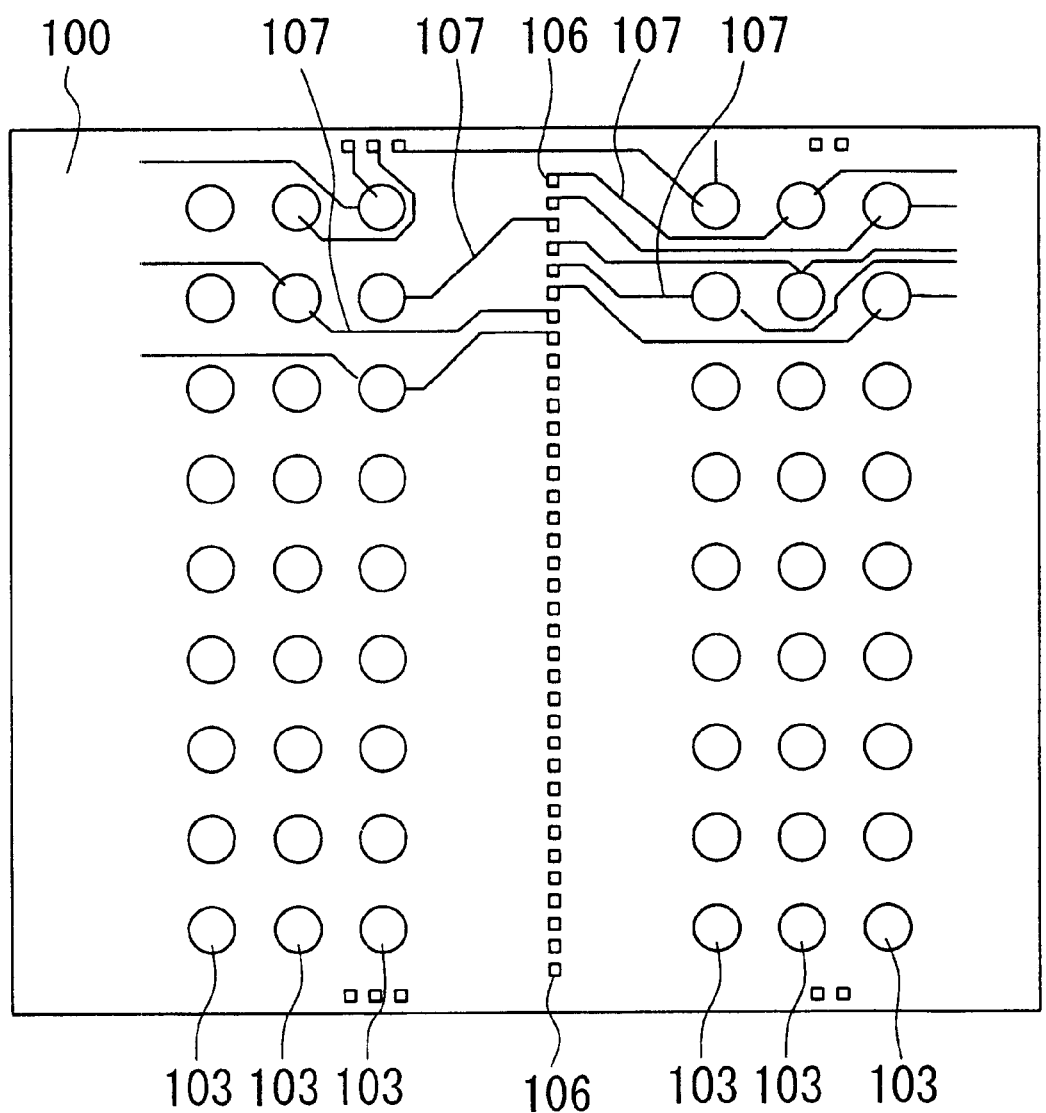
FIG. 8 is a bottom view of the above DRAM.
Figure 9:
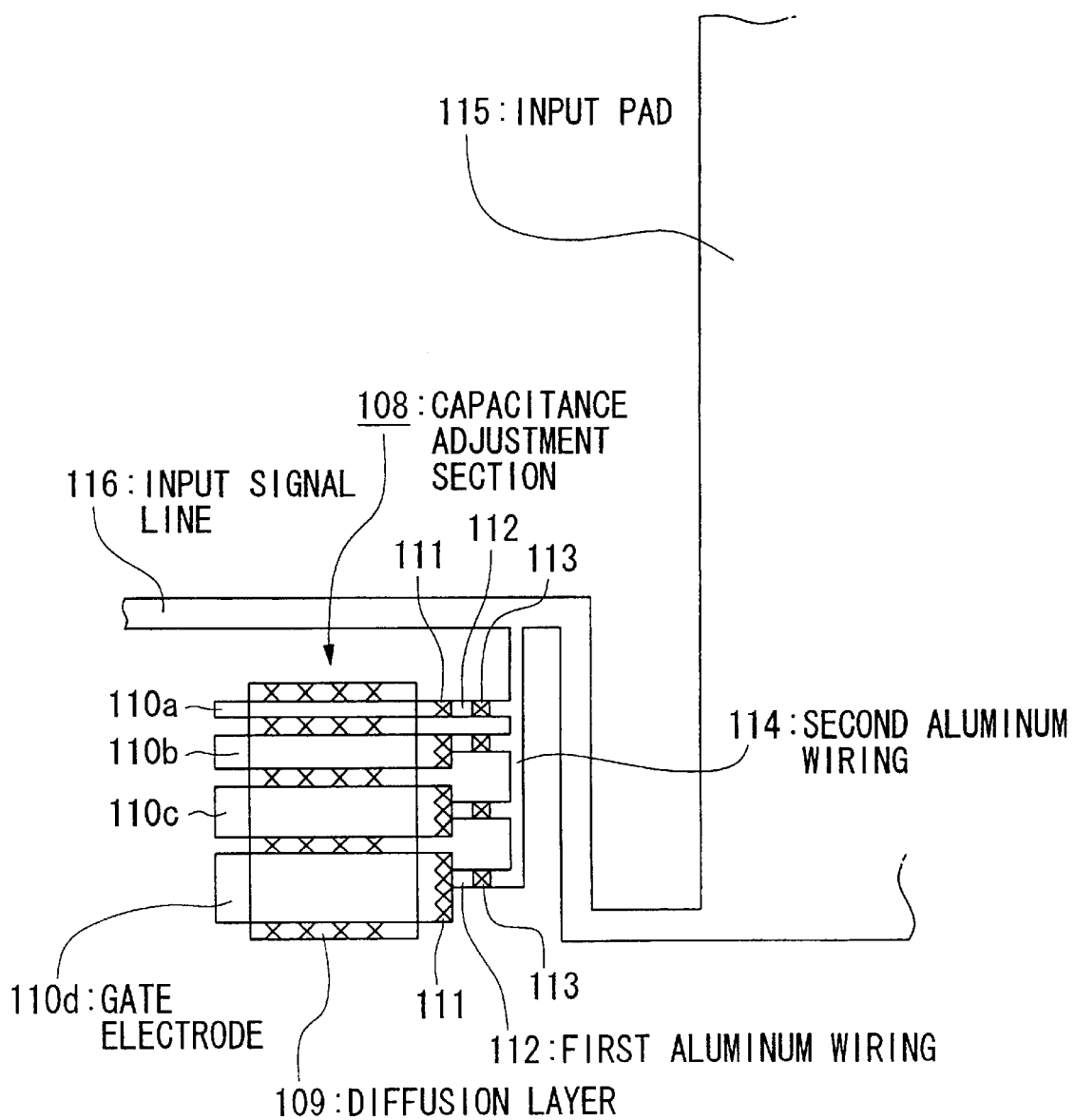
FIG. 9 is a plan view showing an example of a capacitance adjustment section of a DRAM according to conventional technology.

FIG. 4 is a diagram showing a DRAM (semiconductor device) of this third embodiment, showing in particular the construction of a capacitance adjustment section which is a feature of the present invention. Furthermore, FIG. 5 is a cross-sectional view along the line A—A of FIG. 4. The wiring structure of the DRAM of this embodiment is a double layer aluminum wiring construction, as was the case for the first and second embodiments.

As shown in FIG. 5, in a capacitance adjustment section 18 of a DRAM according to this third embodiment, an input pad 19 comprising a first aluminum layer 20 (conductive layer) and a second aluminum layer 21 (conductive layer) separated by an interlayer insulation film 22 forms an interlayer capacitance, and this interlayer capacitance is used for adjusting the wiring capacitance of an input signal line 23. The capacitance adjustment section 18, as shown in FIG. 4 and FIG. 5, has a first aluminum layer 20 which is divided into a plurality (4 columns and 4 rows, totaling 16 regions in this embodiment) of regions 24a and 24b. Of the divided regions 24a and 24b, for the first, second and third columns from the left of the second, third and fourth rows from the top as shown in FIG. 4, that is, for a total of nine divided regions 24a, a plurality (nine in the case of this embodiment) of contacts 25, which penetrate the interlayer insulation film 22 and short circuit the first aluminum layer 20 and the second aluminum layer 21, are provided on each divided region 24a, as shown in FIG. 5. Furthermore, in the case of the seven divided regions 24b of the uppermost row and right hand most column as shown in FIG. 4, no contacts 25 are provided, and the first aluminum layer 20 and the second aluminum layer 21 are not short circuited.

According to the capacitance adjustment section 18 of the present embodiment, because the first aluminum layer 20 of the input pad 19 is divided into a plurality of regions 24a and 24b, and is furthermore separated into the regions 24a for which contacts 25 are formed and the regions 24b for which no contacts 25 are formed, the two aluminum layers 20 and 21 are short circuited for those regions 24a in which contacts 25 are formed, meaning those divided regions 24a will not generate a capacitance, whereas in contrast, the two aluminum layers 20, 21 are not short circuited for those regions 24b without contacts 25, meaning those divided regions 24b will generate a capacitance. As a result, in the case of the third embodiment, a capacitance equivalent to seven times the interlayer capacitance obtained from a single divided region 24b is able to be added to a wiring capacitance, where the capacitance obtained from a single divided region 24b is determined by the surface area of the divided region 24b and the thickness of the interlayer insulation film 22. Consequently, by increasing or decreasing the number of divided regions 24b for which the two aluminum layers 20 and 21 are not short circuited, the value of the overall interlayer capacitance for the entire pad can be adjusted, enabling alterations in the size of the adjustment made to the wiring capacitance.

The capacitance adjustment section 18 of the third embodiment aims to use the relatively large surface area occupied by the input pad 19 as the capacitance adjustment section, and because additional space is not required for the capacitance adjustment section, this method is particularly effective in terms of reducing the surface area occupied by the capacitance adjustment section. Moreover, this embodiment offers the additional advantage that, because the surface area of the input pad 19 itself is quite large, the size of the capacitance adjustment possible is also large. Furthermore, by dividing the first aluminum layer 20 up into even smaller regions, even finer incremental capacitance adjustments are possible.

The technical scope of the present invention is not limited to the working examples described above and includes various other modifications which retain the gist of the present invention. For example, in the first and second embodiments, the case was described for an input signal line as the target wiring for capacitance adjustment, but applicable targets for a capacitance adjustment section of the present invention are not limited to input signal lines, and other lines such as a clock signal line within a circuit could also be targeted. Moreover, the objective of the present invention need not be limited to matching the timing of a signal across a plurality of pins, and a capacitance adjustment section of the present invention could also be used for adding capacitance to certain wiring within a circuit in the case where the timing for that wiring is to be intentionally delayed. Furthermore, suitable combinations of conventional capacitance adjustment sections, capacitance adjustment sections utilizing line capacitance such as the first and second embodiments, and capacitance adjustment sections utilizing the interlayer capacitance of an input pad section such as the third embodiment are also possible.

Appropriate alterations of the actual construction of the capacitance adjustment sections shown in the above embodiments, such as alterations in the number of bent portions or the number of teeth comprising the shape resembling the teeth of a comb for the capacitance adjustment wiring or the GND wiring, or alterations in the number of divided sections within the input pad section, are of course possible. Furthermore, the scope of the present invention is not limited to DRAM chips of double layer wiring construction, and may be applied to a variety of semiconductor devices of multilayer interconnection construction.

What is claimed is:

1. A semiconductor device comprising a capacitance adjustment section for adjusting wiring capacitance, wherein said capacitance adjustment section comprises a capacitance adjustment wiring which is connected to a target wiring for capacitance adjustment for adjusting wiring capacitance, and a constant voltage wiring which is formed on a same layer as said capacitance adjustment wiring and to which is applied a constant voltage, and said capacitance adjustment wiring and said constant voltage wiring are positioned proximately and form a predetermined line capacitance, and said line capacitance is used to adjust a wiring capacitance of said target wiring for capacitance adjustment.

2. A semiconductor device according to claim 1, wherein said constant voltage wiring is either one of power supply voltage wiring and earthed voltage wiring.

3. A semiconductor device according to claim 1, wherein at least either one of said capacitance adjustment wiring and said constant voltage wiring incorporates bent sections.

4. A semiconductor device according to claim 1, wherein at least either one of said capacitance adjustment wiring and said constant voltage wiring is formed in a shape resembling the teeth of a comb.

5. A semiconductor device according to claim 1, wherein said capacitance adjustment section is formed from wiring provided in an uppermost layer of a multilayer interconnection structure.

6. A semiconductor device according to claim 5, wherein said capacitance adjustment section is layered on top of either one of elements and wiring constructed in layers other than said uppermost layer.

7. A semiconductor device according to claim 1, wherein said target wiring for capacitance adjustment is an input signal line.

8. A semiconductor device according to claim 1, wherein said target wiring for capacitance adjustment is a clock signal line within a circuit.

9. A semiconductor device comprising:
    a capacitance adjustment section, said capacitance adjustment section comprising:
        first and second conductive layers, said first conductive layer being divided into a plurality of first regions;
        an insulation layer electrically isolating said first and second conductive layers from one another and electrically isolating said first regions from one another; and
        at least one contact, said at least one contact providing an electrical contact between at least one of the first regions and the second conductive layer,
    wherein a value of capacitance across the capacitance adjustment section is a function of a number of the first regions that are connected by the contacts to the second conductive layer.

10. The semiconductor device according to claim 9, wherein said second conductive layer is divided into a plurality of second regions.

11. The semiconductor device according to claim 9, wherein, in plan view, the first layer is entirely contained within the second layer.

* * * * *